US010513136B2

(12) United States Patent
Paskalova

(10) Patent No.: US 10,513,136 B2
(45) Date of Patent: Dec. 24, 2019

(54) HYDROPHILIC AND HYDROPHOBIC MODIFICATION OF A PRINTING SURFACE

(71) Applicant: KYOCERA Document Solutions Inc., Osaka (JP)

(72) Inventor: Svetlana Paskalova, Torrance, CA (US)

(73) Assignee: KYOCERA DOCUMENT SOLUTIONS INC., Osaka (JP)

( * ) Notice: Subject to any disclaimer, the term of this patent is extended or adjusted under 35 U.S.C. 154(b) by 218 days.

(21) Appl. No.: 15/596,737

(22) Filed: May 16, 2017

(65) Prior Publication Data

US 2018/0333968 A1 Nov. 22, 2018

(51) Int. Cl.
| | | |
|---|---|---|
| B41J 11/00 | (2006.01) | |
| B41M 5/00 | (2006.01) | |
| B41M 7/00 | (2006.01) | |
| G03G 15/00 | (2006.01) | |
| H05H 1/00 | (2006.01) | |
| H01J 37/32 | (2006.01) | |
| G03G 15/20 | (2006.01) | |

(52) U.S. Cl.
CPC ........ B41M 5/0011 (2013.01); B41J 11/0015 (2013.01); B41M 7/0072 (2013.01); G03G 15/6582 (2013.01); H01J 37/321 (2013.01); H01J 37/32027 (2013.01); H01J 37/3277 (2013.01); H01J 37/32403 (2013.01); H01J 37/32752 (2013.01); H05H 1/00 (2013.01); B41M 7/009 (2013.01); G03G 15/2007 (2013.01)

(58) Field of Classification Search
CPC ................ B41M 5/0011; B41M 7/0027; B41J 11/0015; B41J 11/002; G03G 15/2007
See application file for complete search history.

(56) References Cited

U.S. PATENT DOCUMENTS

| 5,262,208 A | 11/1993 | Krapivina et al. | |
|---|---|---|---|
| 6,528,129 B1 * | 3/2003 | Kondo | B41M 5/52 427/535 |
| 8,511,815 B2 | 8/2013 | Yamanobe | |
| 9,073,357 B1 | 7/2015 | Condello et al. | |
| 2009/0207224 A1 * | 8/2009 | Cofler | B41J 3/28 347/102 |
| 2013/0001204 A1 * | 1/2013 | Mistry | H01H 1/24 219/121.59 |

OTHER PUBLICATIONS

Wesley Taylor, "Technical Synopsis of Plasma Surface Treatments", Dec. 2009. (Year: 2009).*

(Continued)

*Primary Examiner* — Huan H Tran
(74) *Attorney, Agent, or Firm* — McDonnell Boehnen; Hulbert & Berghoff LLP

(57) ABSTRACT

In one aspect, a method is described. The method may include exposing a printing surface to a first plasma in order to increase a hydrophilicity of the printing surface. The method may further include, after increasing the hydrophilicity of the printing surface, depositing a printing material on the printing surface. Additionally, the method may include, after depositing the printing material on the printing surface, exposing the printing surface to a second plasma in order to increase a hydrophobicity of the printing surface.

20 Claims, 6 Drawing Sheets

(56) References Cited

OTHER PUBLICATIONS

Plasmatech, inc., "Plasma Polymerized Thin Films for Surface Engineering", copyrighted 2007. (Year: 2007).*
https://www.youtube.com/watch?v=8ahvdqHXKfM "Why Would I Need a Hydrophobic Vs Hydrophilic Coating or Vice-Versa?", published on Oct. 7, 2015.*
Aculon Hydrophobic & Superhydrophobic Coatings in Slow-Motion, https://www.youtube.com/watch?v=X1FbH8kCSG8, published Nov. 7, 2014. (Year: 2014).*
What is Plasma Surface Modification?, Plasma Etch, Inc., website downloaded from http://www.plasmaetch.com/plasma-surface-modification.php (3 pages).

\* cited by examiner

HYDROPHILIC AND HYDROPHOBIC MODIFICATION OF A PRINTING SURFACE

BACKGROUND

In recent years, various types of printing devices have become popular for both business and consumer use. In addition to traditional black and white printers, color printers, scanners, copiers, fax machines, and other components are now common. Multi-function peripherals (MFPs) that support two or more of these functions are also widely available.

Among other functions, these printing devices are used to print graphics or text onto a printing surface, such as paper. Printing onto a printing surface may include, for instance, inkjet printing or laser printing processes.

It is desirable to improve on the arrangements of the prior art or at least to provide one or more useful alternatives to help to improve printing processes.

SUMMARY

In one aspect, a method is described. The method may include (i) performing a first plasma surface modification process, wherein performing the first plasma surface modification process comprises exposing a printing surface to a first plasma, thereby increasing a hydrophilicity of the printing surface; (ii) after performing the first plasma surface modification process, depositing a printing material on the printing surface; and (iii) after depositing the printing material on the printing surface, performing a second plasma surface modification process, wherein performing the second plasma surface modification process comprises exposing the printing surface to a second plasma, thereby increasing a hydrophobicity of the printing surface.

In a further aspect, an apparatus is described. The apparatus may include (i) a first plasma chamber configured to expose a printing surface to a first plasma, thereby increasing a hydrophilicity of the printing surface; (ii) a printing device configured to deposit a printing material on the printing surface; and (iii) a second plasma chamber configured to expose the printing surface to a second plasma, thereby increasing a hydrophobicity of the printing surface.

In a further aspect, a system is described. The system may be configured for use in connection with a printing device and may include (i) a first plasma chamber configured to (a) expose a printing surface to a first plasma, thereby increasing a hydrophilicity of the printing surface and (b) provide the printing surface to the printing device for printing; and (ii) a second plasma chamber configured to (a) receive the printing surface from the printing device after printing and (b) expose the printing surface to a second plasma, thereby increasing a hydrophobicity of the printing surface.

These as well as other aspects, advantages, and alternatives will become apparent to those of ordinary skill in the art by reading the following detailed description with reference where appropriate to the accompanying drawings. Further, it should be understood that the description provided in this summary section and elsewhere in this document is intended to illustrate the claimed subject matter by way of example and not by way of limitation.

DETAILED DESCRIPTION

Example methods and systems are described herein. Other example embodiments or features may further be utilized, and other changes may be made, without departing from the scope of the subject matter presented herein. In the following detailed description, reference is made to the accompanying figures, which form a part thereof.

The example embodiments described herein are not meant to be limiting. Thus, aspects of the present disclosure, as generally described herein and illustrated in the figures, can be arranged, substituted, combined, separated, and designed in a wide variety of different configurations, all of which are explicitly contemplated herein.

Further, unless context suggests otherwise, the features illustrated in each of the figures may be used in combination with one another. Thus, the figures should be generally viewed as component aspects of one or more overall embodiments, with the understanding that not all illustrated features are necessary for each embodiment.

I. Overview

Illustrative embodiments relate to example printing systems and corresponding printing methods. The printing systems and methods may be used to improve the quality and efficiency of printing.

In example arrangements, a printing system may include a hydrophilic-treatment device, a printing device, and a hydrophobic-treatment device. The hydrophilic-treatment device may generate a plasma and perform a plasma surface modification process that causes a printing surface to become more hydrophilic. The printing device may then print on the printing surface by depositing ink or toner on the printing surface. Because the printing surface has been treated to be more hydrophilic, the printing device may use less ink or toner to print on the printing surface than it otherwise would. The hydrophobic-treatment device may generate a plasma and, after the printing device deposits the ink or toner onto the printing surface, the hydrophobic-treatment device may perform a plasma surface modification process that causes the printing surface to become more hydrophobic. By increasing the hydrophobicity of the printing surface, the printing surface may be more resistant to water and may allow for better preservation of the printing surface in humid environments or in environments where the printing surface may otherwise be exposed to water or other liquids.

It should be understood that the above examples are provided for illustrative purposes, and should not be construed as limiting. As such, the systems and methods may additionally or alternatively include other features or include fewer features, without departing from the scope of the invention.

II. Example Systems and Methods

Figure 1:
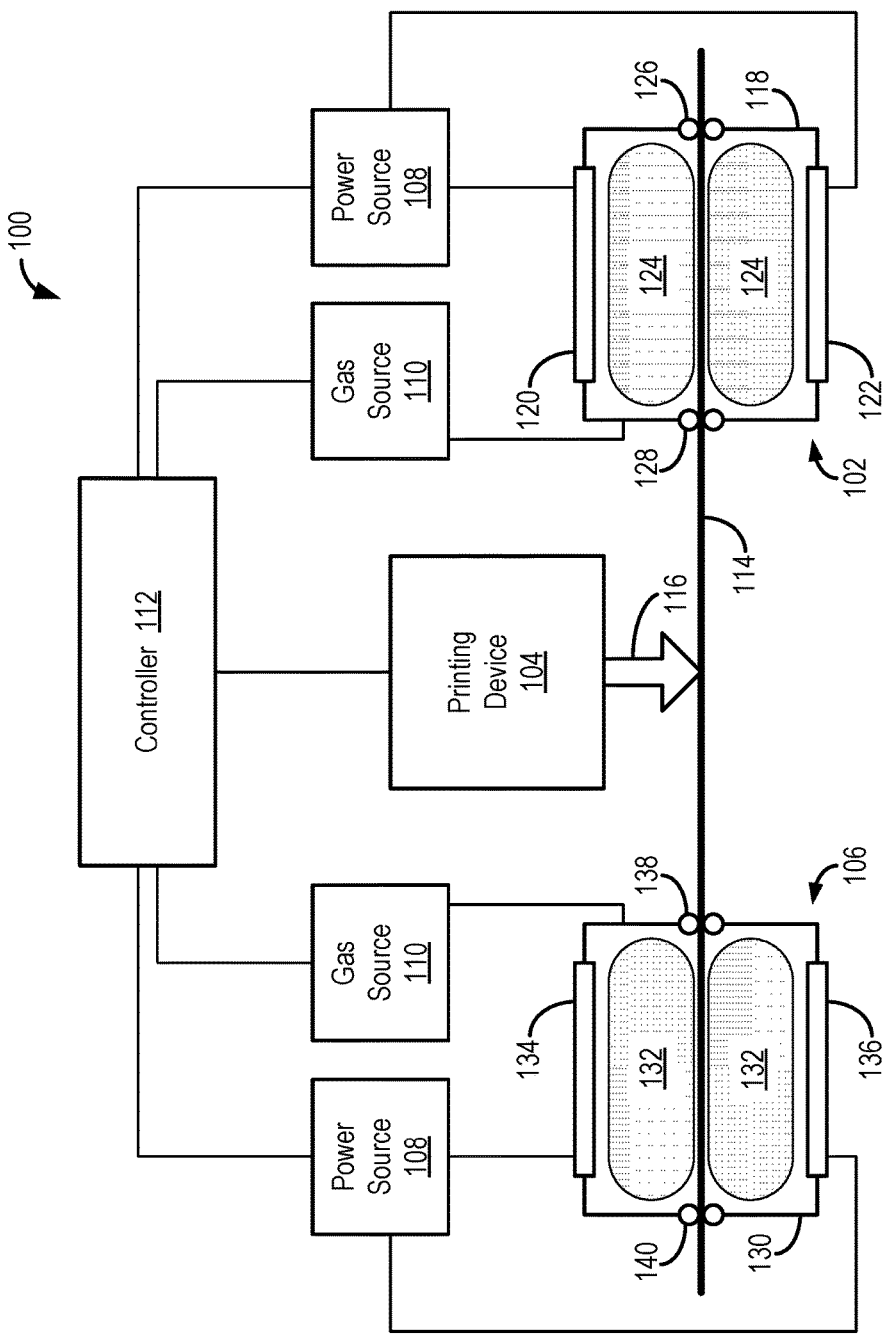
FIG. 1 depicts a block diagram of a printing system, according to an example embodiment.

FIG. 1 depicts a block diagram of a printing system 100 according to an example embodiment. The printing system 100 includes a hydrophilic-treatment device 102, a printing device 104, a hydrophobic-treatment device 106, one or more power sources 108, one or more gas sources 110, and a controller 112. The hydrophilic-treatment device 102 may be configured to increase a hydrophilicity of a printing surface 114, the printing device 104 may be configured to deposit a printing material 116 onto the printing surface 114, and the hydrophobic-treatment device 106 may be configured to increase a hydrophobicity of the printing surface 114.

In order to increase the hydrophilicity of the printing surface 114, the hydrophilic-treatment device 102 may be configured to generate a plasma for performing a plasma surface modification process on the printing surface 114. As such, the hydrophilic-treatment device 102 may include a plasma chamber 118. The plasma chamber 118 may include or take the form of a pressurized housing configured to receive and contain gas from the gas source 110. The plasma chamber 118 may contain pressurized gas from the gas source 110 at a pressure below atmospheric pressure (e.g., between 100 mTorr and 500 mTorr), above atmospheric pressure, or equal to atmospheric pressure, and the plasma chamber 118 may be configured to ionize the gas from the gas source 110.

In order to ionize the gas from the gas source 110, the plasma chamber 118 may further include one or more electrodes 120, 122 coupled to one or more power sources 108. The power source 108 may generate a radio frequency (RF) voltage signal (e.g., a 13.56 MHz signal) and supply the RF voltage signal across the electrodes 120, 122. The RF voltage signal may create a varying electric field between the electrodes 120, 122. This varying electric field may cause atoms or molecules of the gas to release electrons and become ionized. The ionized atoms or molecules may then be accelerated by the electric field, causing collisions between the accelerated atoms or molecules and other non-ionized atoms or molecules. These collisions may result in further ionization of the other non-ionized atoms or molecules. Once enough atoms or molecules are ionized, the gas may become conductive and form a plasma 124 between the electrodes 120, 122.

In some examples, the plasma 124 may be generated using alternative methods. For example, the plasma 124 may be generated by applying a direct current (DC) voltage across the electrodes 120, 122 to generate a DC arc plasma. As another example, the plasma chamber 118 may include a conductive coil for generating an inductively coupled plasma by applying the RF voltage across the coil. Further, in some examples, the plasma 124 may be generated by using a combination of one or more of these methods.

In any case, once the plasma 124 is generated, the printing surface 114 may be exposed to the plasma 124. For example, the printing surface 114 may be exposed to the plasma 124 by passing the printing surface 114 through the plasma chamber 118. To facilitate this, the plasma chamber 118 may include an input feed mechanism 126 for feeding the printing surface 114 into the plasma chamber 118 and an output feed mechanism 128 for feeding the printing surface 114 out of the plasma chamber 118.

The input and output feed mechanisms 126, 128 may take various forms. For instance, the feed mechanisms 126, 128 may include motorized or un-motorized rollers. As noted above, the plasma chamber 118 may be pressurized to a pressure above or below atmospheric pressure. As such, the feed mechanisms 126, 128 may be configured to maintain a vacuum seal sufficient to maintain the pressure of the plasma chamber 118. For example, if the feed mechanisms 126, 128 include rollers, then the rollers of each feed mechanism may be spring-loaded such that the rollers are compressed against one another to maintain a sufficient vacuum seal. In examples where the plasma chamber 118 is at atmospheric pressure, the feed mechanisms 126, 128 may not be configured to maintain such a vacuum seal.

As the printing surface 114 passes through the plasma chamber 118 of the hydrophilic-treatment device 102, the printing surface 114 may undergo plasma surface modification. In particular, the printing surface 114 may be fed between the electrodes 120, 122 such that the electrodes are arranged on opposing sides of the printing surface 114 and so that the printing surface 114 is exposed to the plasma 124. As such, the plasma 124 may interact with the printing surface 114 in a manner that causes the printing surface 114 to become more hydrophilic.

Increasing the hydrophilicity of the printing surface 114 may allow for improved printing on the printing surface 114. For instance, high print quality may be achieved when printing material, such as ink or toner, is able to spread across the printing surface 114 rather than coalescing into clumps. A hydrophilic surface with a high surface energy may be easily wettable, such that ink or toner deposited on the hydrophilic surface will spread. Thus, by increasing the surface energy of the printing surface 114, the printing surface 114 may become more hydrophilic, thereby allowing for improved printing on the printing surface 114.

Accordingly, the plasma 124 can be configured such that exposing the printing surface 114 to the plasma 124 increases the surface energy of the printing surface 114. In particular, the plasma 124 may be a low temperature plasma, such that the plasma 124 may only interact with the uppermost layers of the printing surface 114, leaving the bulk properties of the printing surface 114 material unchanged. Further, the plasma 124 may be generated from different gases based on a material of the printing surface 114. For example, exposing a paper surface to an oxygen plasma, an oxygen/nitrogen plasma, or an air plasma may increase the surface energy of the paper surface. As another example, exposing a plastic surface to an oxygen plasma or an oxygen/nitrogen plasma may increase the surface energy of the plastic surface. As yet another example, exposing a polytetrafluoroethylene (PTFE) surface to a hydrogen plasma or a hydrogen/nitrogen plasma may increase the surface energy of the PTFE surface. Other examples are possible as well. Thus, the gas from the gas source 110 may include oxygen, hydrogen, nitrogen, air, or any other gas suitable for generating plasma for hydrophilic surface modification.

The controller 112 may then cause the gas source 110 to supply the appropriate gas to the plasma chamber 118 based on the material of the printing surface 114. For instance, if the printing surface 114 includes a paper surface, then the controller 112 may cause the gas source 110 to supply air, oxygen, or a blend of oxygen and nitrogen to the plasma chamber 118. Similarly, if the printing surface 114 includes a plastic surface, then the controller 112 may cause the gas source 110 to supply oxygen or a blend of oxygen and nitrogen to the plasma chamber 118. And if the printing surface 114 includes a PTFE surface, then the controller 112 may cause the gas source 110 to supply hydrogen or a blend of hydrogen and nitrogen to the plasma chamber 118. The controller 112 may then cause the hydrophilic-treatment device 102 to generate the plasma 124 using the supplied gas as described above, and the printing surface 114 may be exposed to the generated plasma 124.

Once the printing surface 114 is exposed to the plasma 124, thereby increasing the hydrophilicity of the printing surface 114 and making the printing surface 114 more wettable, the controller 112 may cause the printing device 104 to print on the printing surface 114 by depositing the printing material 116 onto the printing surface 114. As noted above, for instance, the printing device 104 may include an inkjet printer or a laser printer, and the printing material 116 may include ink or toner. Because the printing surface 114 has undergone a hydrophilic surface treatment as described above, the printing material 116 from the printing device 104 may more readily spread across and adhere to the printing surface 114, such that the printing device 104 may use less ink or toner while still printing a high quality image on the printing surface 114.

After the printing device 104 prints onto the printing surface 114, the printing surface 114 may be fed through the hydrophobic-treatment device 106 to increase a hydrophobicity of the printing surface 114. Making the printing surface 114 more hydrophobic may allow for improved preservation of the printing surface 114. For instance, a hydrophobic material may be resistant to water or non-wettable, such that increasing the hydrophobicity of the printing surface 114 may allow the printing surface 114 to be more resilient in humid environments or in environments where the printing surface 114 may otherwise be exposed to water or other liquids.

Contrary to hydrophilic surfaces, which have a high surface energy, hydrophobic surfaces have a low surface energy. Thus, in order to increase the hydrophobicity of the printing surface 114, the hydrophobic-treatment device 106 may be configured to perform a plasma surface modification process that lowers the surface energy of the printing surface 114. As such, the hydrophobic-treatment device 106 may include a plasma chamber 130 for generating a plasma 132.

The plasma chamber 130 of the hydrophobic-treatment device 106 may be similar to or the same as the plasma chamber 118 of the hydrophilic-treatment device 102. For example, the plasma chamber 130 may include or take the form of a pressurized housing configured to receive and contain gas from the gas source 110. The plasma chamber 130 may contain pressurized gas from the gas source 110 at a pressure below atmospheric pressure, above atmospheric pressure, or equal to atmospheric pressure, and the plasma chamber 130 may be configured to ionize the gas from the gas source 110. For instance, the plasma chamber 130 may include electrodes 134, 136, and the power source 108 may ionize the gas from the gas source 110 to generate the plasma 132 by supplying an RF and/or DC voltage across the electrodes 134, 136 as discussed above. Alternatively or additionally, the plasma chamber 130 may include a conductive coil, and the power source 108 may ionize the gas by applying an RF voltage across the conductive coil, thereby creating the plasma 132 as an inductively coupled plasma.

Once the plasma 132 is generated, the printing surface 114 may be exposed to the plasma 132 by passing the printing surface 114 through the plasma chamber 130. To facilitate this, the plasma chamber 130 may include input and output feed mechanisms 138, 140 for feeding the printing surface 114 through the plasma chamber 130. The input and output feed mechanisms 138, 140 of the hydrophobic-treatment device 106 may be similar to or the same as the input and output feed mechanisms 126, 128 of the hydrophilic-treatment device 102. For instance, the feed mechanisms 138, 140 may include motorized or un-motorized rollers and, in examples where the plasma chamber 130 is pressurized above or below atmospheric pressure, the feed mechanisms 138, 140 may be configured to maintain a vacuum seal sufficient to maintain the pressure of the plasma chamber 130, as described above.

As the printing surface 114 passes through the plasma chamber 130 of the hydrophobic-treatment device 106, the printing surface 114 may undergo plasma surface modification. In particular, feeding the printing surface 114 through the plasma chamber 130 may expose the printing surface 114 to the plasma 132, and the plasma 132 may interact with the printing surface 114 in a manner that lowers the surface energy of the printing surface 114, thereby causing the printing surface 114 to become more hydrophobic.

Accordingly, the plasma 132 can be configured such that exposing the printing surface 114 to the plasma 132 decreases the surface energy of the printing surface 114. Similar to the plasma 124 of the hydrophilic-treatment device 102, the plasma 132 of the hydrophobic-treatment device 106 may be a low temperature plasma, such that the plasma 132 may only interact with the uppermost layers of the printing surface 114, leaving the bulk properties of the printing surface 114 material unchanged. Further, the plasma 132 may be generated using methane ($CH_4$) gas or some other hydrocarbon gas, as these hydrocarbon plasmas may be used to polymerize the surface and decrease the surface energies for various types of printing materials. Thus, the gas from the gas source 110 may further include methane, other hydrocarbon gases, or any other gas suitable for generating plasma for hydrophobic surface modification.

In some examples, various components of the printing system 100 may be arranged within or as part of the printing device 104 such that the processes of performing a hydrophilic treatment, printing, and performing a hydrophobic treatment on a printing surface as described above may be carried out by the printing device 104. For example, both the hydrophilic-treatment device 102 and the hydrophobic-treatment device 106 may be integrated with the printing device 104 such that the printing surface 114 may be fed directly from the hydrophilic-treatment device 102 to the hydrophobic-treatment device 106 with the printing device 104 depositing printing material 116 onto the printing surface 114 as the printing surface 114 is fed between the hydrophilic-treatment device 102 and the hydrophobic-treatment device 106. In other examples, various components of the printing system 100 may be separate from the printing device 104.

In some examples, the printing system 100 may be configured to perform some or all of the above processes concurrently. For example, the hydrophilic-treatment device 102 may perform plasma surface modification on a first portion of the printing surface 114 while the printing device 104 prints on a second portion of the printing surface 114 that has already undergone plasma surface modification by the hydrophilic-treatment device 102 and/or while the hydrophobic-treatment device 104 performs plasma surface modification on a third portion of the printing surface 114 that has already been printed on by the printing device 104. In other examples, some or all of these processes may be carried out sequentially.

In some examples, the printing system 100 may be further configured to expose the printing surface 114 to a monoatomic gas plasma in order to prevent or reduce growth of microorganisms on the printing surface. Such a plasma treatment may be carried out by the hydrophilic-treatment device 102 and may be performed as a part of or prior to the hydrophilic plasma surface modification processes described above.

In some examples, the printing system 100 may be further configured to print on multiple sides of the printing surface 114. For instance, because the printing surface 114 is fed between the electrodes 120, 122, 134, 136 of the hydrophilic- and hydrophobic-treatment devices 102, 106, opposing sides of the printing surface 114 may both undergo the plasma surface modification processes described above. As such, printing system 100 may include a second printing device for depositing printing material 116 on an underside of the printing surface 114. Alternatively, the printing device 104 may be configured to deposit printing material 116 on both sides of the printing surface 114.

Figure 2:
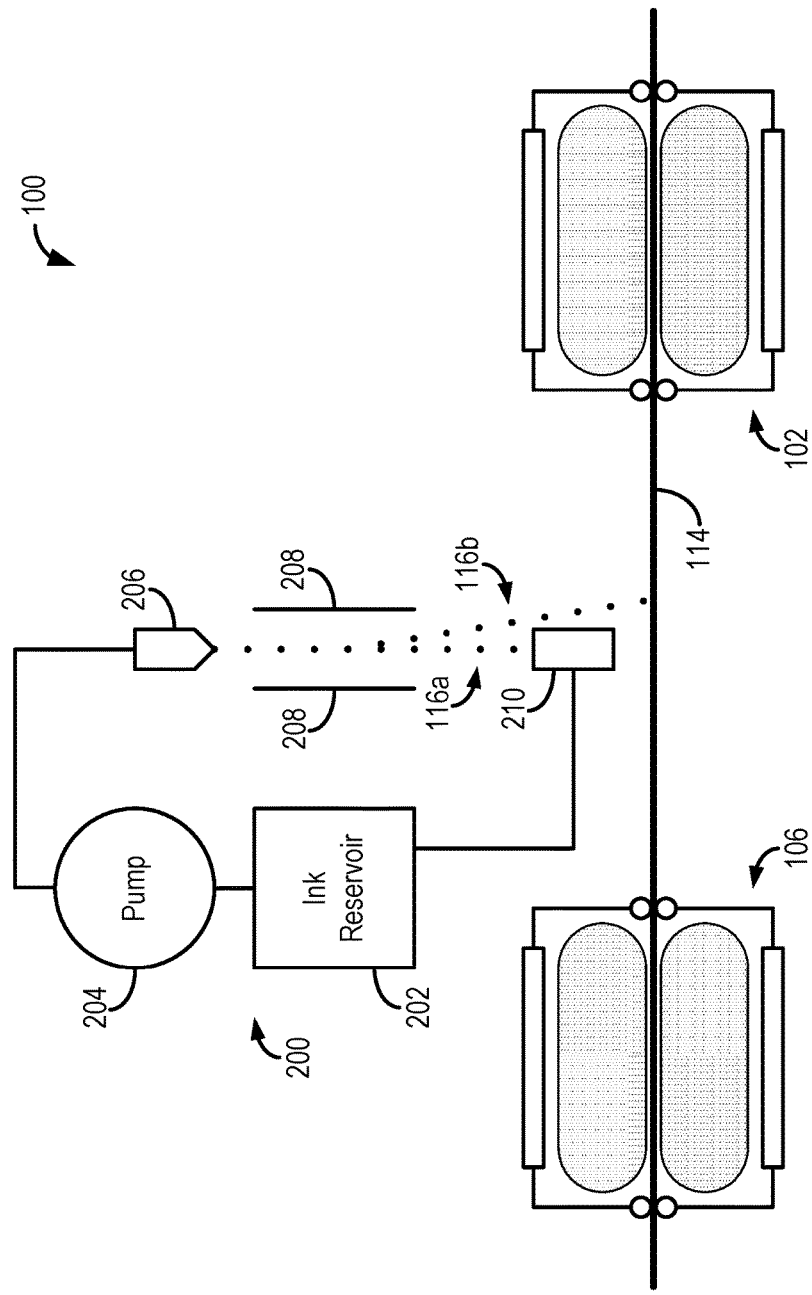
FIG. 2 depicts a block diagram of the printing system including an inkjet printing device, according to an example embodiment.

FIG. 2 depicts an example of the printing system 100 in which the printing device 104 takes the form of an inkjet printing device 200. The inkjet printing device 200 may include an ink reservoir 202, a pump 204, a nozzle 206, one or more deflection plates 208, and a gutter 210.

The ink reservoir 202 may include a reservoir for holding the printing material 116, which may take the form of aqueous printer ink to be used with the inkjet printing device 200. The pump 204 may be coupled to the ink reservoir 202 and the nozzle 206, and the pump 204 may pump the ink from the ink reservoir 202 to the nozzle 206. The nozzle 206 can then use thermal or piezoelectric techniques to convert the ink into a plurality of droplets 116a, 116b that pass by the deflection plates 208 after they are emitted from the nozzle 206.

Further, the nozzle 206 may apply an electrostatic charge to the ink droplets 116a, 116b such that the ink droplets 116a, 116b may be deflected along a particular path by being exposed to an electric field. In particular, the inkjet printing device 200 may control a voltage that is applied to the deflection plates 208 such that the inkjet printing device 200 may alter the surrounding electric field of the ink droplets 116a, 116b by altering the voltage applied to the deflection plates 208. By doing so, the inkjet printing device 200 may cause some of the ink droplets 116b to be deflected onto the printing surface 114, while allowing the remaining ink droplets 116a to travel along without deflection and be collected in the gutter 210. Ink droplets 116a collected in the gutter 210 may then be returned to the ink reservoir 202 for reuse by the inkjet printing device 200.

Accordingly, the printing surface 114 can be fed through the hydrophilic-treatment device 102 in order to increase the hydrophilicity of the printing surface 114, thereby allowing for high quality printing on the printing surface 114 while using less ink; the inkjet printer 200 can then print onto the hydrophilic printing surface 114; and the printing surface 114 can then be fed through the hydrophobic-treatment device 106 in order to increase the hydrophobicity of the printing surface 114, thereby allowing for better preservation of the printing surface 114.

Figure 3:
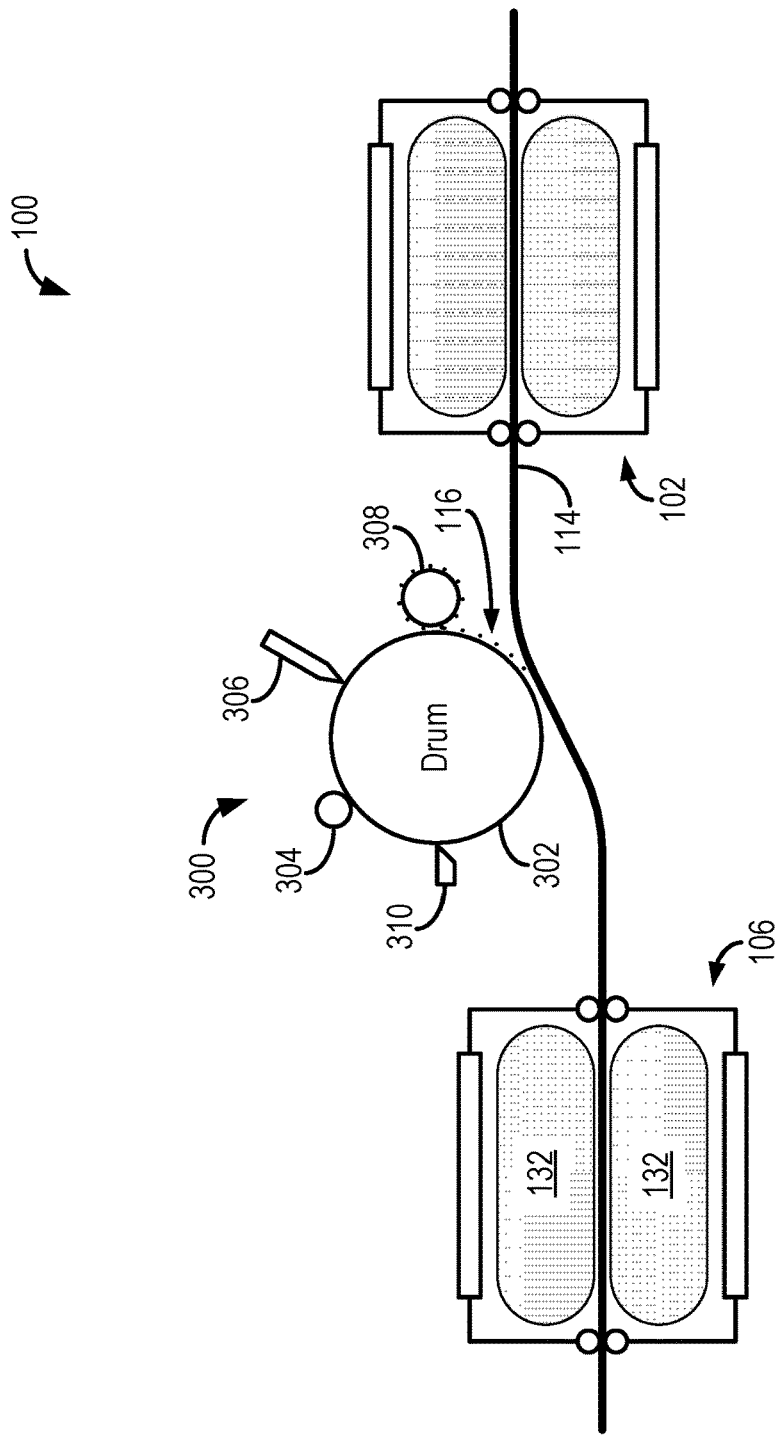
FIG. 3 depicts a block diagram of the printing system including a laser printing device, according to an example embodiment.

FIG. 3 depicts an example of the printing system 100 in which the printing device 104 takes the form of a laser printing device 300. The laser printing device 300 may include a drum 302, a charger 304, a laser 306, a toner transfer device 308, and a cleaning system 310.

The drum 302 may be in electrical contact with the charger 304 such that the laser printing device 300 may charge the drum 302 by applying a voltage to the charger 304. The laser printing device 300 may then cause the laser 306 to pass back and forth over the charged drum 302 in a defined pattern. The electromagnetic radiation from the laser 306 may cause the areas of the defined pattern on the drum 302 to become uncharged. The toner transfer device 308 may then transfer printing material 116, which may take the form of printer toner, onto the drum 308. In particular, the toner may be electrostatically attracted to the charged areas of the drum 308 such that most or all of the toner that is transferred to the drum 308 is only transferred to the areas of the drum that were not discharged by the laser 306. The drum 302 may then transfer the toner from the drum 302 to the printing surface 114 by direct contact between the drum 302 and the printing surface 114. Finally, any excess toner that is not transferred from the drum 302 to the printing surface 114 may be removed from the drum 302 by the cleaning system 310.

A conventional laser printing device may further include a fuser for heating the printing surface after the toner is deposited on the printing surface and thereby fusing the toner to the printing surface. However, in the present example, the hydrophobic-treatment device 106 may alternatively act as the fuser. In particular, as the printing surface 114 (with the deposited toner) is passed through the hydrophobic-treatment device 106, the plasma 132 may sufficiently heat the printing surface 114 and the toner in order to fuse the toner to the printing surface 114. Such a fusing process can be carried out as part of the hydrophobic plasma surface modification (e.g., using a methane plasma or some other hydrocarbon plasma) or as a separate process using a different gas.

Accordingly, the printing surface 114 can be fed through the hydrophilic-treatment device 102 in order to increase the hydrophilicity of the printing surface 114, thereby allowing for high quality printing on the printing surface 114 while using less toner; the laser printer 300 can then print onto the hydrophilic printing surface 114; and the printing surface 114 can then be fed through the hydrophobic-treatment device 106 in order to fuse the toner to the printing surface 114 and increase the hydrophobicity of the printing surface 114, thereby allowing for better preservation of the printing surface 114.

Figure 4:
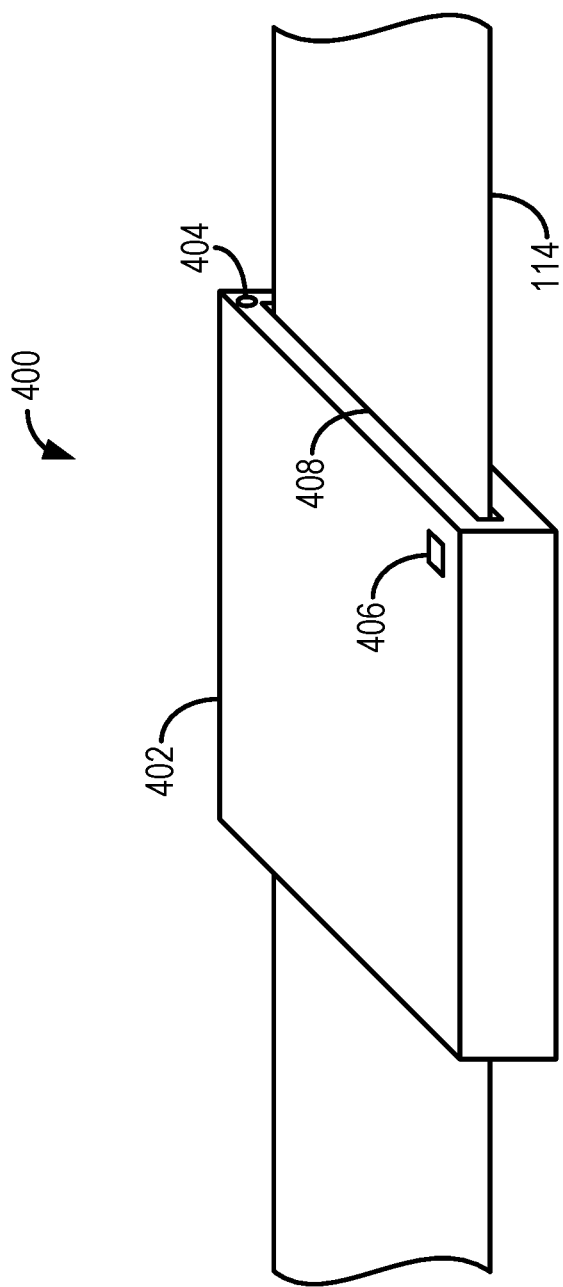
FIG. 4 depicts a plasma treatment device of the printing system, according to an example embodiment.

FIG. 4 depicts a plasma treatment device 400, one or more of which may be included in the printing system 100, according to an example embodiment. For example, the hydrophilic-treatment device 102 and/or the hydrophobic-treatment device 106 may take the form of or may include the plasma treatment device 400. The plasma treatment device 400 includes a plasma chamber 402, one or more gas inlets 404, one or more electrical contacts 406, and one or more feed mechanisms 408.

The plasma chamber 402 may be capable of containing various gases pressurized at, above, or below atmospheric pressure. For example, the plasma chamber 402 may be connected to a vacuum pump, perhaps via the one or more gas inlets 404, and the vacuum pump may pump some or substantially all of the air from the plasma chamber 402. The plasma chamber 402 may then receive one or more gases from a gas source connected to the plasma chamber 402 via the one or more gas inlets 404.

A power source may be connected to the plasma treatment device 400 via the one or more electrical contacts 406, and the electrical contacts 406 may be connected to one or more electrodes and/or conductive coils (not shown) located within the plasma chamber 402. As such, the power source may apply an RF or DC signal to the electrical contacts 406 in order to generate a plasma from the gas in the plasma chamber 402 as described above. And, as further described above, the printing surface 114 may then be passed through the plasma chamber 402 via the feed mechanisms 408, thereby exposing the printing surface 114 to the plasma and making the printing surface 114 more hydrophilic or hydrophobic.

As shown, the plasma chamber 402 may be proportioned such that only a portion of the printing surface 114 may be arranged within the plasma chamber 402 at any given time. In such examples, a portion of the printing surface 114 may undergo hydrophilic or hydrophobic plasma surface modification while a different portion of the printing surface 114 is subjected to another process (e.g., inkjet printing or laser printing). However, in other examples, the plasma chamber 402 may be proportioned such that the entire printing surface 114 may be arranged within the plasma chamber 402 at once.

Figure 5:
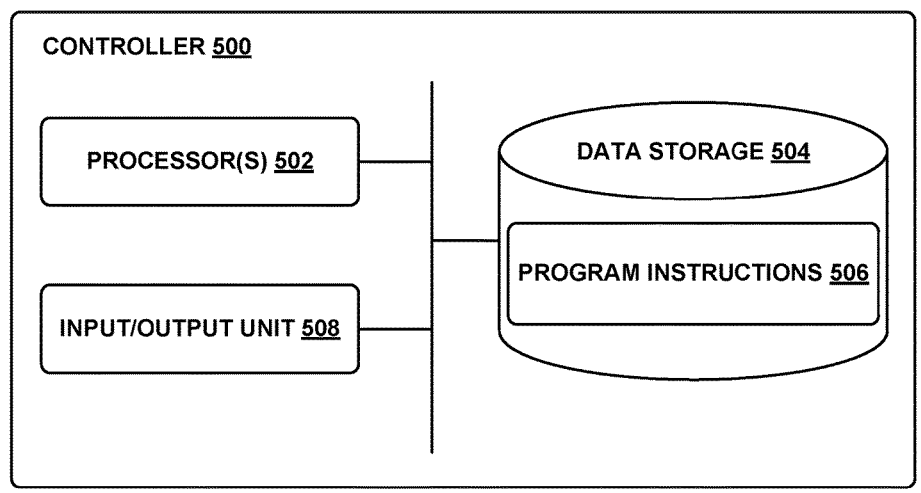
FIG. 5 depicts a block diagram of a controller for use in connection with the printing systems depicted in FIGS. 1-3, according to an example embodiment.

In order to carry out the methods, processes, or functions disclosed in this specification or the accompanying drawings, the controller 112 and/or various other components of the printing system 100 may include various computing device components. FIG. 5 depicts an example embodiment 500 of computing device components (e.g., functional elements of a computing device) that may be included in the controller 112 and/or other components of the printing system 100.

The computing device components 500 may include one or more processors 502, data storage 504, program instructions 506, and an input/output unit 508, all of which may be coupled by a system bus or a similar mechanism. The one or more processors 502 may include one or more central processing units (CPUs), such as one or more general purpose processors and/or one or more dedicated processors (e.g., application specific integrated circuits (ASICs) or digital signal processors (DSPs), etc.). The one or more processors 502 can be configured to execute computer-readable program instructions 506 that are stored in the data storage 504 and are executable to provide at least part of the functionality described herein.

The data storage 504 may include or take the form of one or more computer-readable storage media that may be read or accessed by at least one of the one or more processors 502. The one or more computer-readable storage media can include volatile and/or non-volatile storage components, such as optical, magnetic, organic, or other memory or disc storage, which may be integrated in whole or in part with at least one of the one or more processors 502. In some embodiments, the data storage 504 may be implemented using a single physical device (e.g., one optical, magnetic, organic, or other memory or disc storage unit), while in other embodiments, the data storage 504 may be implemented using two or more physical devices.

The input/output unit 508 may include user input/output devices, network input/output devices, and/or other types of input/output devices. For example, the input/output unit 508 may include user input/output devices, such as a touch screen, a keyboard, a keypad, a computer mouse, liquid crystal displays (LCD), light emitting diodes (LEDs), displays using digital light processing (DLP) technology, cathode ray tubes (CRT), light bulbs, and/or other similar devices. Network input/output devices may include wired network receivers and/or transceivers, such as an Ethernet transceiver, a Universal Serial Bus (USB) transceiver, or similar transceiver configurable to communicate via a twisted pair wire, a coaxial cable, a fiber-optic link, or a similar physical connection to a wireline network, and/or wireless network receivers and/or transceivers, such as a Bluetooth transceiver, a Zigbee transceiver, a Wi-Fi transceiver, a WiMAX transceiver, a wireless wide-area network (WWAN) transceiver and/or other similar types of wireless transceivers configurable to communicate via a wireless network.

The computing device components 500 may be implemented in whole or in part in various components of the printing systems depicted in FIGS. 1-4 and/or in at least one device remotely located from the printing systems, such as a workstation or personal computer. Generally, the manner in which the computing device components 500 are implemented may vary, depending upon the particular application.

Figure 6:
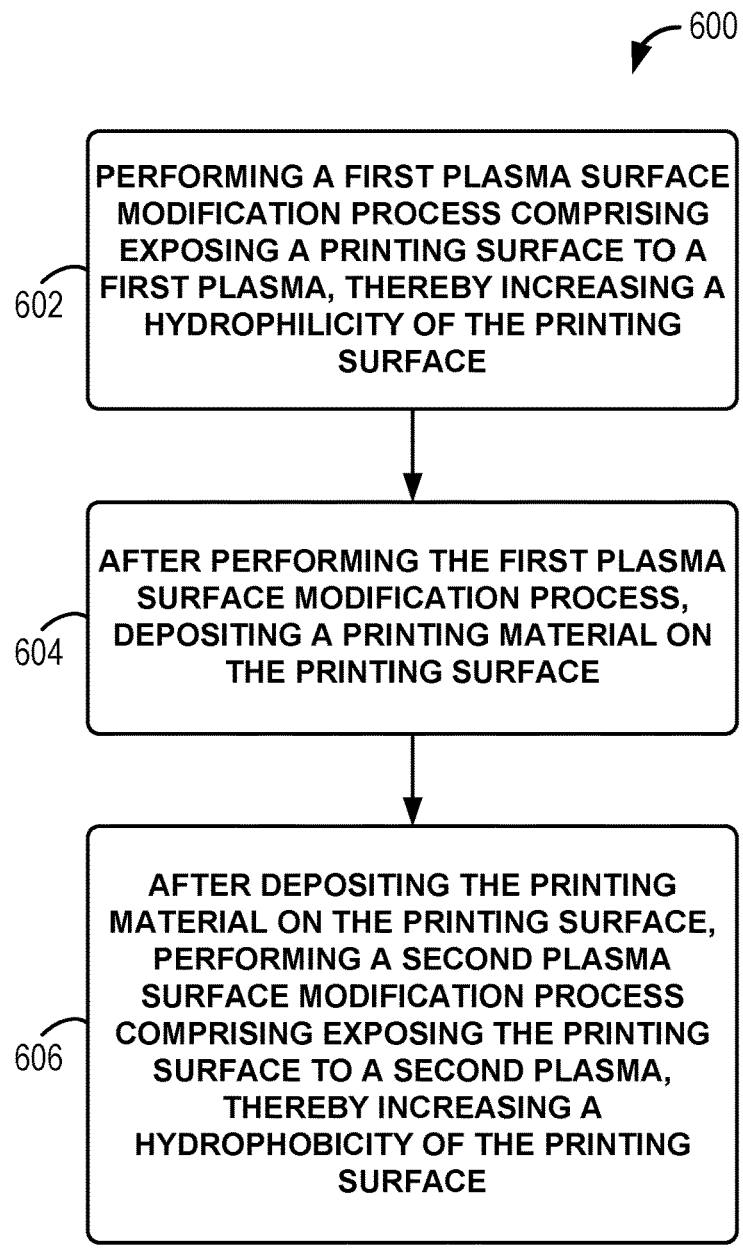
FIG. 6 depicts a flowchart of a method, according to an example embodiment.

FIG. 6 depicts a flowchart of an example method 600 that could be carried out in connection with one or more of the printing systems described herein. The example method 600 may include one or more operations, functions, or actions, as depicted by one or more of blocks 602, 604, and/or 606, each of which may be carried out by any of the systems described by way of FIGS. 1-5; however, other configurations could be used as well.

Furthermore, those skilled in the art will understand that the flowchart described herein illustrates functionality and operation of certain implementations of example embodiments. In this regard, each block of the flow diagram may represent a module, a segment, or a portion of program code, which includes one or more instructions executable by a processor for implementing specific logical functions or steps in the process. The program code may be stored on any type of computer readable medium, for example, such as a storage device including a disk or hard drive. In addition, each block may represent circuitry that is wired to perform the specific logical functions in the process. Alternative implementations are included within the scope of the example embodiments of the present application in which functions may be executed out of order from that shown or discussed, including substantially concurrent or in reverse order, depending on the functionality involved, as would be understood by those reasonably skilled in the art.

Method 600 begins at block 602, which includes performing a first plasma surface modification process comprising exposing a printing surface to a first plasma, thereby increasing a hydrophilicity of the printing surface. In line with the discussion above, the first plasma may be an air plasma, an oxygen plasma, a hydrogen plasma, an oxygen/nitrogen plasma, or a hydrogen/nitrogen plasma depending on a material of the printing surface. Further, the first plasma may be generated using a first plasma chamber, such that exposing the printing surface to the first plasma involves feeding the printing surface through the first plasma chamber.

Method 600 continues at block 604, which includes, after performing the first plasma surface modification process, depositing a printing material on the printing surface. In line with the discussion above, the printing material may include an ink, and depositing the printing material on the printing surface may involve depositing the ink on the printing surface using an inkjet printing process. Alternatively, the printing material may include a toner, and depositing the printing material on the printing surface may involve depositing the toner on the printing surface using a laser printing process.

Method 600 continues at block 706, which includes, after depositing the printing material on the printing surface, performing a second plasma surface modification process comprising exposing the printing surface to a second plasma, thereby increasing a hydrophobicity of the printing surface. In line with the discussion above, the second plasma may be a methane plasma or other hydrocarbon plasma that may be generated using a second plasma chamber, and exposing the printing surface to the second plasma may involve feeding the printing surface through the second plasma chamber. Further, in examples where the printing material is a toner, exposing the printing surface to the second plasma may heat the toner, thereby fusing the toner to the printing surface.

In addition to the operations depicted in FIG. 6, other operations may be utilized with the example printing systems presented herein.

III. Conclusion

The particular arrangements shown in the Figures should not be viewed as limiting. It should be understood that other embodiments may include more or less of each element shown in a given Figure. Further, some of the illustrated elements may be combined or omitted. Yet further, example embodiments may include elements that are not illustrated in the Figures.

Additionally, while various aspects and embodiments have been disclosed herein, other aspects and embodiments will be apparent to those skilled in the art. The various aspects and embodiments disclosed herein are for purposes of illustration and are not intended to be limiting, with the true scope being indicated by the following claims. Other embodiments may be utilized, and other changes may be made, without departing from the scope of the subject matter presented herein. It will be readily understood that the aspects of the present disclosure, as generally described herein, and illustrated in the figures, can be arranged, substituted, combined, separated, and designed in a wide variety of different configurations, all of which are contemplated herein.

What is claimed is:

1. A method comprising:
    generating a first plasma between a first electrode and a second electrode of a first plasma chamber;
    generating a second plasma between a third electrode and a fourth electrode of a second plasma chamber;
    performing a first plasma surface modification process, wherein performing the first plasma surface modification process comprises feeding a printing surface between the first and second electrodes of the first plasma chamber, thereby exposing the printing surface to the first plasma and increasing a hydrophilicity of the printing surface;
    after performing the first plasma surface modification process, depositing a printing material on the printing surface; and
    after depositing the printing material on the printing surface, performing a second plasma surface modification process, wherein performing the second plasma surface modification process comprises feeding the printing surface between the third and fourth electrodes of the second plasma chamber, thereby exposing the printing surface to the second plasma and increasing a hydrophobicity of the printing surface.

2. The method of claim 1, wherein exposing the printing surface to the first plasma comprises exposing the printing surface to a hydrogen plasma, a nitrogen plasma, an oxygen plasma, or an air plasma.

3. The method of claim 1, wherein exposing the printing surface to the second plasma comprises exposing the printing surface to a hydrocarbon plasma.

4. The method of claim 1, wherein the printing material comprises an ink, and wherein depositing the printing material on the printing surface comprises depositing the ink on the printing surface using an inkjet printing process.

5. The method of claim 1, wherein the printing material comprises a toner, and wherein depositing the printing material on the printing surface comprises depositing the toner on the printing surface using a laser printing process.

6. The method of claim 5, wherein exposing the printing surface to the second plasma heats the toner, thereby fusing the toner to the printing surface.

7. An apparatus comprising:
    a first plasma chamber comprising a first electrode and a second electrode for generating a first plasma between the first and second electrodes;
    a first feed mechanism configured to feed a printing surface between the first and second electrodes, thereby exposing the printing surface to the first plasma and increasing a hydrophilicity of the printing surface;
    a printing device configured to deposit a printing material on the printing surface;
    a second plasma chamber comprising a third electrode and a fourth electrode for generating a second plasma between the third and fourth electrodes; and
    a second feed mechanism configured to feed the printing surface between the third and fourth electrodes, thereby exposing the printing surface to the second plasma and increasing a hydrophobicity of the printing surface.

8. The apparatus of claim 7, wherein the printing device is configured to deposit the printing material on the printing surface after the first feed mechanism feeds the printing surface between the first and second electrodes, and wherein the second feed mechanism is configured to feed the printing surface between the third and fourth electrodes after the printing device deposits the printing material on the printing surface.

9. The apparatus of claim 7, wherein at least one of the first plasma chamber or the second plasma chamber is configured to generate the first plasma or the second plasma at atmospheric pressure.

10. The apparatus of claim 7, wherein at least one of the first plasma chamber or the second plasma chamber is configured to generate the first plasma or the second plasma at a pressure between 100 mTorr and 500 mTorr.

11. The apparatus of claim 7, wherein the first plasma comprises a hydrogen plasma, a nitrogen plasma, an oxygen plasma, or an air plasma.

12. The apparatus of claim 7, wherein the second plasma comprises a hydrocarbon plasma.

13. The apparatus of claim 7, wherein the printing material comprises an ink, and wherein the printing device comprises an ink jet printing device configured to deposit the ink on the printing surface using an inkjet printing process.

14. The apparatus of claim 7, wherein the printing material comprises a toner, and wherein the printing device comprises a laser printing device configured to deposit the toner on the printing surface using a laser printing process.

15. The apparatus of claim 14, wherein exposing the printing surface to the second plasma heats the toner, thereby fusing the toner to the printing surface.

16. The apparatus of claim 7, wherein the apparatus is configured to generate the first plasma by applying a first voltage across the first and second electrodes, and wherein the apparatus is configured to generate the second plasma by applying a second voltage across the third and fourth electrodes.

17. A system for use in connection with a printing device, the system comprising:
    a first plasma chamber comprising a first electrode and a second electrode for generating a first plasma between the first and second electrodes;

a first feed mechanism configured to (i) feed a printing surface between the first and second electrodes, thereby exposing the printing surface to the first plasma and increasing a hydrophilicity of the printing surface, and (ii) provide the printing surface to the printing device for printing;

a second plasma chamber comprising a third electrode and a fourth electrode for generating a second plasma between the third and fourth electrodes; and a second feed mechanism configured to (i) receive the printing surface from the printing device after printing and (ii) feed the printing surface between the third and fourth electrodes, thereby exposing the printing surface to the second plasma and increasing a hydrophobicity of the printing surface.

18. The system of claim 17, wherein at least one of the first plasma chamber or the second plasma chamber is configured to generate the first plasma or the second plasma at atmospheric pressure.

19. The system of claim 17, wherein at least one of the first plasma chamber or the second plasma chamber is configured to generate the first plasma or the second plasma at a pressure between 100 mTorr and 500 mTorr.

20. The system of claim 17, wherein the printing device comprises a laser printing device configured to deposit a toner on the printing surface using a laser printing process, and wherein exposing the printing surface to the second plasma heats the toner, thereby fusing the toner to the printing surface.

* * * * *